United States Patent
Weber

(10) Patent No.: US 6,724,548 B2
(45) Date of Patent: Apr. 20, 2004

(54) OBJECTIVE, IN PARTICULAR A PROJECTION LENS FOR MICROLITHOGRAPHY

(75) Inventor: Ulrich Weber, Ulm (DE)

(73) Assignee: Carl Zeiss SMT AG, Oberkochen (DE)

( * ) Notice: Subject to any disclaimer, the term of this patent is extended or adjusted under 35 U.S.C. 154(b) by 0 days.

(21) Appl. No.: 10/375,320

(22) Filed: Feb. 26, 2003

(65) Prior Publication Data

US 2003/0169517 A1 Sep. 11, 2003

(30) Foreign Application Priority Data

Mar. 5, 2002 (DE) ........................................ 102 09 661

(51) Int. Cl.$^7$ ................................................ G02B 7/02
(52) U.S. Cl. ..................................................... 359/819
(58) Field of Search ................... 359/819, 820; 353/100

(56) References Cited

U.S. PATENT DOCUMENTS

| | | | | |
|---|---|---|---|---|
| 4,778,253 A | * | 10/1988 | Siga et al. | 359/819 |
| 5,396,487 A | * | 3/1995 | Abe et al. | 359/819 |
| 5,822,136 A | * | 10/1998 | Semrad et al. | 359/818 |
| 6,097,536 A | * | 8/2000 | Bauer et al. | 359/350 |
| 6,191,898 B1 | | 2/2001 | Trunz et al. | 359/819 |
| 6,285,496 B1 | * | 9/2001 | Bauer et al. | 359/350 |
| 6,307,688 B1 | | 10/2001 | Merz et al. | 359/819 |

* cited by examiner

Primary Examiner—Ricky Mack
(74) Attorney, Agent, or Firm—Welsh & Katz, Ltd.

(57) ABSTRACT

An objective, in particular a projection lens for microlithography, is provided with at least one optical element (8) that is mounted in an inner mount (9a), the inner mount (9a) being connected to the outer mount (9b). A manipulator device (21) performs a displacement of the optical element (8), preferably in at least one direction that lies at least approximately parallel to the optical axis. At least one elastically deformable strip (13) is arranged in a gap (12) between the inner mount (9a) and the outer mount (9b), the strip being connected in each case via a fastening section (15) to the inner mount (9a) and the outer mount (9b), and the two fastening sections (15) being connected to one another by an arcuate section (18, 19) and free bearing parts (16, 17) situated therebetween.

13 Claims, 4 Drawing Sheets

OBJECTIVE, IN PARTICULAR A PROJECTION LENS FOR MICROLITHOGRAPHY

BACKGROUND OF THE INVENTION

1. Field of the Invention

The invention relates to an objective having at least one optical element that is mounted in an inner mount, the inner mount being connected to an outer mount, and having a manipulator device for translatory displacement of the optical element in at least one direction. The invention relates in particular to a projection lens for microlithography for the purpose of producing semiconductor devices.

2. Description of the Related Art

In objectives, in particular projection lenses of projection exposure machines, it is necessary to displace individual optical elements such as, for example, lenses, in order to remove aberrations with reference to the remaining optical elements. This adjustment can be performed as a translatory displacement parallel to the optical axis, or else transverse to it. Known for this purpose are manipulator devices or actuators that displace an inner mount, in which the optical element is mounted, with reference to an outer mount. Reference may be made here to, for example, DE 198 59 634 A1 and DE 199 01 295.

However, there is a problem with these displacements that it is not always ensured that a purely translatory or linear displacement occurs. Rather, it is also possible for tilting movements and/or displacements transverse to the desired direction to occur. Moreover, a translatory movement is intended to be performed along or parallel to the desired direction with as little friction as possible, in order to avoid hysteresis effects.

SUMMARY OF THE INVENTION

It is therefore the object of the present invention to create an objective in which individual optical elements to be displaced can be displaced in a fashion as free from friction as possible, in particular along or parallel to the optical axis, the aim being the occurrence of no tiltings, as far as possible, and no displacements in other directions than the desired direction.

This object is achieved according to the invention by virtue of the fact that at least one elastically deformable strip is arranged in a gap between the inner mount and the outer mount, the strip being connected in each case via a fastening section to the inner mount and the outer mount, and the two fastening sections being connected to one another by an arcuate section and free bearing parts situated therebetween.

A preferred embodiment is represented in this case by a projection lens for microlithography for the purpose of producing semiconductor devices.

Owing to the elastically deformable strip arranged between the inner mount and the outer mount, a purely translatory displacement of the inner mount with reference to the outer mount is performed parallel to or along the optical axis. This is effected by virtue of the fact that the free bearing parts of the elastic strip can each roll on the associated circumferential wall, the inner mount also simultaneously being displaced in the purely translatory or linear fashion relative to the outer mount via the fastening sections.

In a preferred embodiment of the invention, it is possible here for the strip to be provided in each case with two arcuate sections and free bearing parts situated therebetween. A closed rolling strip with an exact translatory movement is produced when in this case the arcuate sections, the fastening sections and the free bearing parts are in one piece.

In a further preferred embodiment, the inner mount is constructed as an inner ring and the gap is constructed as an annular gap in which a plurality of rolling strips are arranged distributed over the circumference. At least the side of the outer mount facing the inner ring should likewise in this case have an annular shape.

In order to achieve a bearing surface that is as even as possible and therefore good, the inner ring and the outer mount can be provided in the region of the annular gap with flat spots, and the rolling strips can be provided at the sites of the flat spots.

In general, it will be sufficient to arrange three rolling strips distributed uniformly over the circumference in the annular gap. However, in order to increase the stiffness, it is also possible, of course, to arrange more than three rolling strips, for example four rolling strips, in which case two rolling strips should be arranged opposite one another in each case.

Advantageous refinements and developments of the invention emerge from the subclaims and from the following exemplary embodiment described in principle with the aid of the drawing, in which:

DETAILED DESCRIPTION

Figure 1:
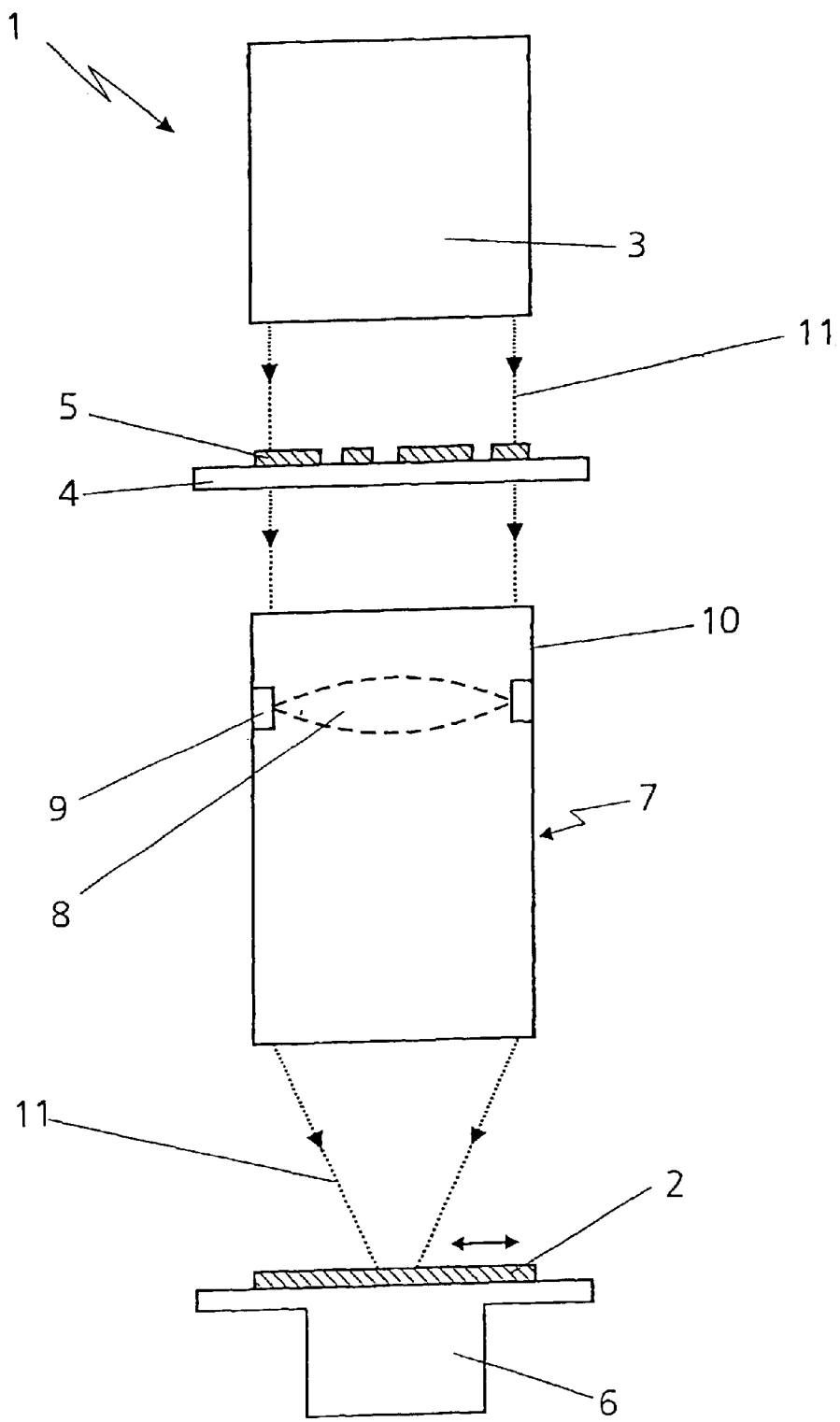
FIG. 1 shows an illustration of the principle of a projection exposure machine for microlithography that can be used to expose structures on wafers coated with photosensitive materials.

A projection exposure machine 1 for microlithography is illustrated in FIG. 1. Said machine is used to expose structures on a substrate, which is coated with photosensitive materials and generally consists predominantly of silicon and is denoted as a wafer 2, for the purpose of producing semiconductor components such as, for example, computer chips.

The projection exposure machine 1 in this case essentially comprises an illuminating device 3, a device 4 for holding and exactly positioning a mask provided with a grid-like structure, a so-called reticle 5, by means of which the later structures on the wafer 2 are determined, a device 6 for holding, moving and exactly positioning this very wafer 2, and an imaging device, specifically a projection lens 7 with a plurality of optical elements such as, for example, lenses 8, which are mounted via mounts 9 in a lens housing 10 of the projection lens 7.

The fundamental functional principle provides in this case that the structures introduced into the reticle 5 are exposed on the wafer 2 with a reduction of the structures.

After exposure has been performed, the wafer 2 is moved on in the direction of the arrow such that a multiplicity of individual arrays each having the structure prescribed by the reticle 5 are exposed on the same wafer 2. Because of the stepwise feed movement of the wafer 2 in the projection exposure machine 1, the latter is frequently also denoted as a stepper.

The illuminating device 3 provides a projection beam 11, for example light or a similar electromagnetic radiation, required for imaging the reticle 5 on the wafer 2. A laser or similar can be used as source for this radiation. The radiation is shaped in the illuminating device 3 via optical elements such that upon striking the reticle 5 the projection beam 11 has the desired properties with regard to diameter, polarization, shape of the wave front and the like.

Via the projection beam 11, an image of the reticle 5 is produced and, as already explained above, transferred onto the wafer 2 in an appropriately reduced fashion by the projection lens 7. The projection lens 7 has a multiplicity of individual refractive and/or diffractive optical elements such as, for example, lenses, mirrors, prisms, end plates and the like.

Figure 2:
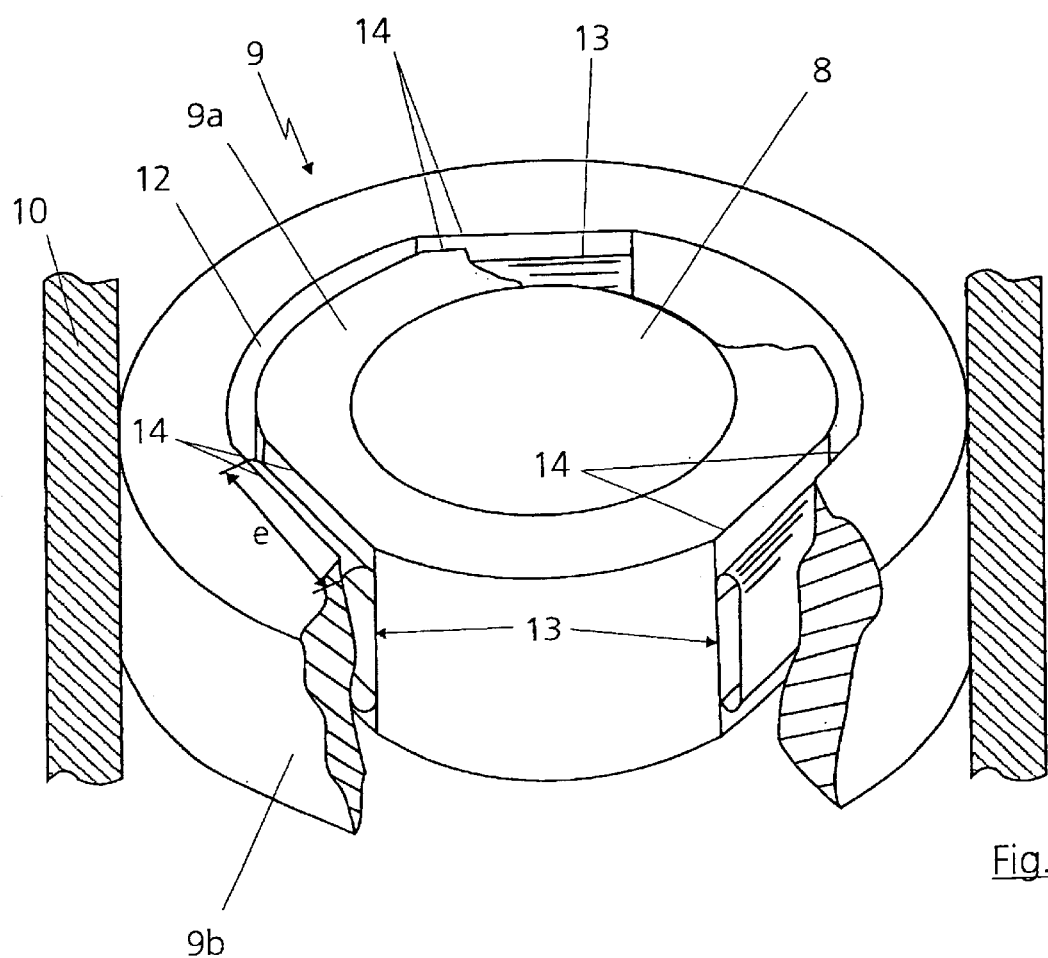
FIG. 2 shows a perspective illustration of a lens as optical element with the associated mount and an elastic strip.

FIG. 2 shows in a perspective illustration a lens 8 such as is built into the projection lens 7 with the associated mount 9. As may be seen, the mount 9 has an inner mount 9a in the form of an inner ring, and an outer mount 9b in the form of an outer ring. Located between the inner mount 9a and the outer mount 9b is an annular gap 12. Three elastically deformable strips arranged distributed uniformly over the circumference are arranged in the form of rolling strips 13 in the annular gap 12.

Figure 3:
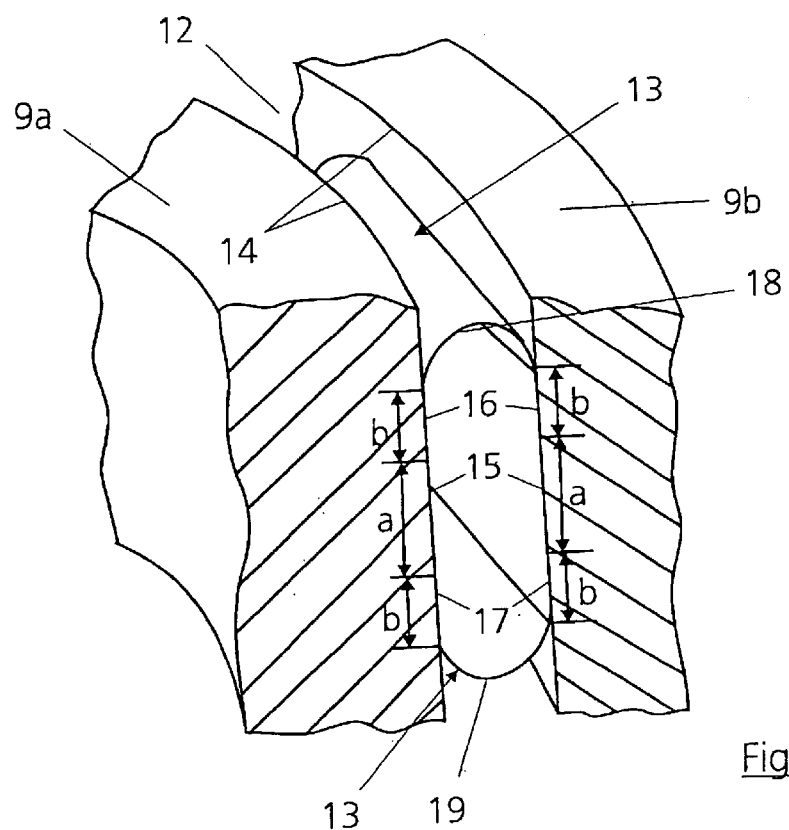
FIG. 3 shows an enlarged detail from FIG. 2 with a part of the inner mount and of the outer mount as well as a rolling strip situated therebetween.

As may be seen from FIGS. 2 and 3, both the inner ring 9a and the outer ring 9b have on their mutually facing sides three flat spots 14 in the shape of a ring that are situated distributed over the circumference. The rolling strips 13 bear flat with at least approximately equal widths in the region of the flat spots, which have a width e.

Figure 4:
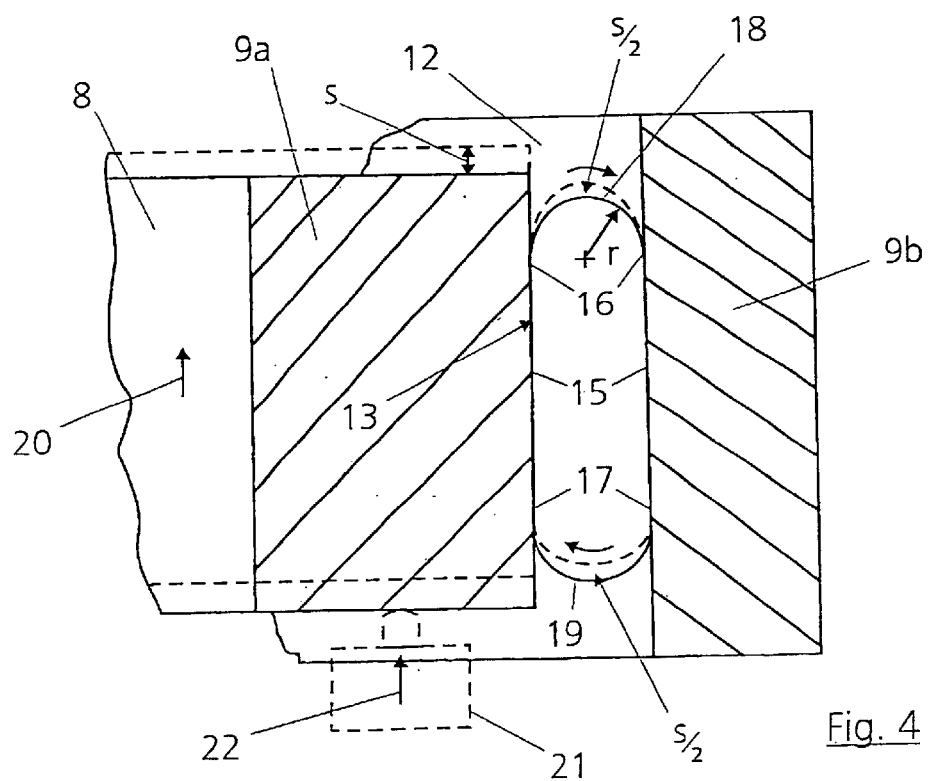
FIG. 4 shows a detail of a sectional illustration with the mode of operation of the rolling strip according to the invention.

The configuration of a rolling strip 13 may be seen in more detail from the enlarged illustrations in FIGS. 3 and 4. Each of the rolling strips 13 is in one piece and has, to a rough approximation, an oval shape with two parallel long sides. Each rolling strip 13 has two fastening sections 15. The fastening sections 15 are situated opposite one another and have a length a. Via the two fastening sections, which lie parallel to one another in the annular gap 12, the rolling strip 13 is permanently connected in each case to the associated part of the mount, specifically the inner ring 9a and the outer mount 9b. Adjoining the two long ends of the fastening sections 15 in each case are free bearing parts 16 and 17 that each can have a length b in a basic position, and that likewise bear in a flat fashion against the inner ring 9a or against the inner circumferential wall of the outer mount 9b. Adjoining the free bearing parts 16 and 17 in each case then are arcuate sections 18 and 19, respectively, that connect the free bearing parts 16 and 17 to one another. The result of this is a unipartite closed shape of the strip in the form of a rolling strip.

The three rolling strips 13 arranged distributed over the circumference function in the following way:

In order to achieve a translation displacement of the inner mount 9a, and thus of the lens 8 in the z-direction or parallel to the optical axis, a manipulator device 21 (not illustrated in more detail—see the dashed illustration in FIG. 4) engages at the inner mount 9a and displaces the latter in the direction of the arrow 22, this displacement direction corresponding to the direction of the arrow 20.

The arrangement and configuration of the manipulator device 21 is arbitrary and is governed by the respective case of use. If required, it is also possible to undertake leverages here, it also being possible in this case for the manipulator device 21 to be located in another plane or at another site.

As may be seen from FIG. 4, the inner ring 9a can move upward, together with the lens 8, in the direction of the arrow 20, specifically because of the freely moveable free bearing parts 16 and 17, which bear against the walls of the inner ring 9a and the outer mount 9b and roll on the walls together with the arcuate sections 18 and 19, which are likewise free. In this way, in accordance with the dashed representation the rolling strip moves upward by the distance s/2 in each case with the two arcuate sections 18 and 19, the result being to produce a displacement path for the inner ring 9a by the distance s.

The closed unipartite shape of the rolling strip 13 yields a very stiff shape, in particular with reference to movements directed transverse to the z-axis, while a high degree of mobility is provided in the z-direction. For this purpose, the rolling strips can be constructed as a membrane, for example from a very elastic spring steel strip.

Figure 5:
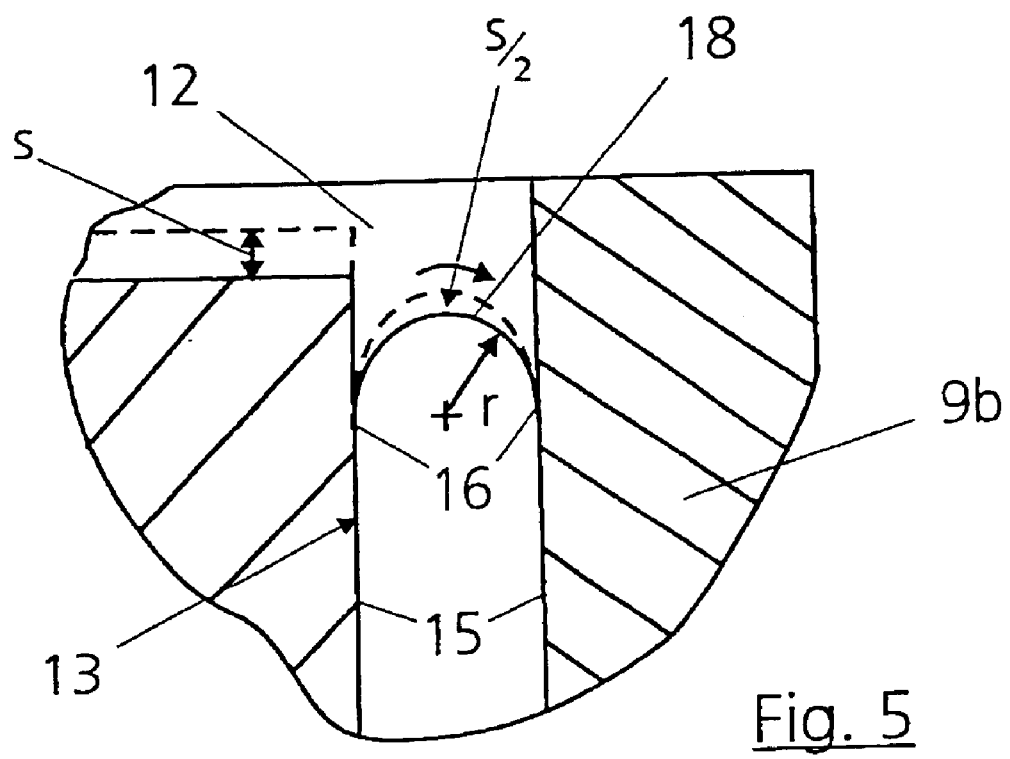
FIG. 5 shows a simplified embodiment in a view in accordance with FIG. 4.

In principle, it also suffices for a displacement of the inner ring 9a to have an arcuate section 18 or 19 on one side which is provided at both its ends with the free bearing parts 16 or 17, which merge in each case into a fastening section 15. In this case, either the two upper free bearing parts 16 or the two lower free bearing parts 17 with their respective arcuate section 18 or 19, respectively, are then omitted, the result being merely a type of door arch. Reference may be made for this purpose to the simplified representation in FIG. 5. However, a higher degree of stability and better guidance result from a closed shape of rolling strip with two arcuate sections 18 and 19.

The rolling strips 13 arranged distributed over the circumference result in a pure linear displacement of the inner ring 9a in conjunction with a high freedom from friction, and thus an avoidance of hysteresis effects.

Stresses occurring in the rolling strip 13 are prescribed by the radius of curvature r of the two arcuate sections 18 and 19. The radius of curvature r is to be selected in this case to be so large that no plastic deformations occur owing to high stresses. The radius of the curvature r is yielded from half the distance of the annular gap 12 between the inner ring 9a and the outer mount 9b. The radius of curvature r is maintained, and thus also is a constant stress in the rolling strip, when the free bearing parts 16 and 17 and the arcuate sections 18 and 19 roll on the associated walls of the inner ring 9a and the outer mount 9b. Owing to the use of the rolling strips 13, the travel is not restricted by an impermissible growth in deformation stresses as is the case with conventional adjusting devices.

When the rolling strips 13 have a sufficiently large width e, a correspondingly high stiffness is produced with reference to displacements transverse to the z-axis and with reference to instances of torsion. If the stiffness is to be increased with reference to undesired displacement directions and instances of torsion, it is also possible if required to provide more than three rolling strips 13.

What is claimed is:

1. An objective having at least one optical element that is mounted in an inner mount, the inner mount being connected to an outer mount, and having a manipulator device for displacing said optical element in at least one direction, wherein at least one elastically deformable strip is arranged in a gap between said inner mount and said outer mount, said strip being connected in each case via a fastening section to said inner mount and said outer mount, and the two fastening sections being connected to one another by an arcuate section and free bearing parts situated therebetween.

2. The objective as claimed in claim 1, wherein said optical element can be displaced in a direction that lies at least approximately parallel to the optical axis, and wherein said elastically deformable strip is arranged in a gap that runs parallel to the optical axis.

3. The objective as claimed in claim 2, wherein said fastening sections are fastened on the mutually facing circumferential walls of said inner mount and said outer mount, and wherein said free bearing parts in each case bear against associated walls, said free bearing parts rolling on the walls in accordance with the displacing movement upon a displacement of said inner mount by said manipulator device.

4. The objective as claimed in claim 1, wherein said strip is constructed as a closed rolling strip in one piece with said fastening sections, said arcuate sections and said free bearing parts.

5. The objective as claimed in claim 4, wherein a plurality of rolling strips are arranged distributed over the circumference of said inner mount and said outer mount.

6. The objective as claimed in claim 5, wherein said inner mount is constructed as an inner ring and said gap is constructed as an annular gap in which said rolling strips are arranged.

7. The objective as claimed in claim 6, wherein said outer mount is of annular construction at least at the inner circumference.

8. The objective as claimed in claim 6, wherein said rolling strips are each arranged in the region of flat spots of said inner ring and said outer mount.

9. The objective as claimed in claim 1, wherein said optical element is a lens.

10. The objective as claimed in claim 1, wherein said elastically deformable strip is a membrane.

11. The objective as claimed in claim 10, wherein said membrane consists of spring steel.

12. The objective as claimed in claim 1, wherein it is constructed as a projection lens for microlithography for the purpose of producing semiconductor devices, said elastically deformable strip being arranged between said inner mount and said outer mount of said optical element.

13. The projection lens as claimed in claim 12, wherein said optical element is a lens.

* * * * *

UNITED STATES PATENT AND TRADEMARK OFFICE
CERTIFICATE OF CORRECTION

PATENT NO. : 6,724,548 B2
DATED : April 20, 2004
INVENTOR(S) : Ulrich Weber

It is certified that error appears in the above-identified patent and that said Letters Patent is hereby corrected as shown below:

Column 1,
Line 52, delete "...free hearing parts..." and replace it with -- ...free bearing parts... --

Signed and Sealed this

Nineteenth Day of April, 2005

JON W. DUDAS
*Director of the United States Patent and Trademark Office*